(12) United States Patent
Hsieh

(10) Patent No.: US 12,733,328 B2
(45) Date of Patent: Sep. 8, 2026

(54) DISPLAY SUBSTRATE COMPRISING A DATA LINE ARRANGED AT A SAME LAYER AS A GATE ELECTRODE, METHOD FOR MANUFACTURING THE SAME, AND DISPLAY DEVICE

(71) Applicant: BOE Technology Group Co., Ltd., Beijing (CN)

(72) Inventor: Changhan Hsieh, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 480 days.

(21) Appl. No.: 17/925,509

(22) PCT Filed: Dec. 29, 2021

(86) PCT No.: PCT/CN2021/142414
§ 371 (c)(1),
(2) Date: Nov. 15, 2022

(87) PCT Pub. No.: WO2023/123033
PCT Pub. Date: Jul. 6, 2023

(65) Prior Publication Data

US 2024/0237367 A1 Jul. 11, 2024

(51) Int. Cl.
*H10K 19/80* (2026.01)
*H10K 19/10* (2026.01)

(52) U.S. Cl.
CPC ............. *H10K 19/80* (2023.02); *H10K 19/10* (2023.02)

(58) Field of Classification Search
CPC ...... H10K 19/80; H10K 19/10; H10K 59/126; H10K 59/131; H10D 30/67; H10D 62/10;
(Continued)

(56) References Cited

U.S. PATENT DOCUMENTS

2005/0053720 A1* 3/2005 Yamazaki .............. H10K 71/00 427/69
2009/0059650 A1* 3/2009 Saito .................... G11C 13/004 365/189.15
(Continued)

FOREIGN PATENT DOCUMENTS

CN 101582424 A 11/2009
CN 107452808 A 12/2017
(Continued)

OTHER PUBLICATIONS

English translation of description for "WO 2018223689 A1" Liu et al, "Array Substrate, Display Panel and Display Device, Dec. 13, 2018" (Year: 2018).*
(Continued)

*Primary Examiner* — Mounir S Amer
*Assistant Examiner* — Nicholas B Michaud
(74) *Attorney, Agent, or Firm* — IPro, PLLC

(57) ABSTRACT

The present disclosure provides a display substrate, a manufacturing method, and a display device. The display substrate includes: a base substrate; a thin film transistor located on the base substrate and including a source electrode, a drain electrode, a gate electrode and an active layer, and thicknesses of the source electrode and the drain electrode being less than a predetermined threshold; a protection layer located at a side of the thin film transistor away from the base substrate and including a first via hole and a second via hole, and a conductive connection pattern being arranged in the first via hole; and a data line arranged at a same layer and made of a same material as the gate electrode, the data line being coupled to the source electrode of the thin film transistor through the conductive connection pattern in the first via hole of the protection layer.

12 Claims, 4 Drawing Sheets

(58) Field of Classification Search
CPC ........ H10D 62/13; H10D 86/00; H01L 21/34; H01L 21/77
USPC ........................................................... 257/40
See application file for complete search history.

(56) References Cited

U.S. PATENT DOCUMENTS

2010/0327282 A1* 12/2010 Aoki ...................... H10K 19/10 257/E27.117
2014/0125901 A1* 5/2014 Tong .................... H10D 86/423 438/34
2014/0312323 A1* 10/2014 Park ................. H10K 59/80516 438/23
2015/0108481 A1 4/2015 Khang et al.
2016/0133486 A1* 5/2016 Andry .................... B23K 26/57 134/1.2
2016/0320650 A1* 11/2016 Ding ................... G02F 1/13338
2018/0005007 A1* 1/2018 Du ....................... G06V 10/145
2018/0212061 A1* 7/2018 Xie ........................ H10D 62/80
2019/0185995 A1* 6/2019 Jo ....................... C23C 16/4401
2020/0135936 A1* 4/2020 Cao .................... H10D 30/6729
2021/0060638 A1* 3/2021 Herle ................... B22D 11/144
2021/0175260 A1* 6/2021 Chen ...................... H10D 86/60

FOREIGN PATENT DOCUMENTS

CN 107768412 A 3/2018
KR 20050100843 A 10/2005
KR 20090043213 A 5/2009
WO WO-2018223689 A1 * 12/2018 ......... G02F 1/13338
WO WO-2020143024 A1 * 7/2020 ........... H01L 27/124

OTHER PUBLICATIONS

English translation of description for "WO 2020143024 A1" Li et al, "Array Substrate and Method for Manufacturing Same, and Display Panel, Jul. 16, 2020" (Year: 2020).*
CN 202180004303.9 first office action dated May 26, 2026.

* cited by examiner

DISPLAY SUBSTRATE COMPRISING A DATA LINE ARRANGED AT A SAME LAYER AS A GATE ELECTRODE, METHOD FOR MANUFACTURING THE SAME, AND DISPLAY DEVICE

CROSS-REFERENCE TO RELATED APPLICATION

This application is the U.S. national phase of PCT Application No. PCT/CN2021/142414 filed on Dec. 29, 2021, the entire contents of which are hereby incorporated by reference.

TECHNICAL FIELD

The present disclosure relates to the field of display technology, in particular to a display substrate, a manufacturing method thereof, and a display device.

BACKGROUND

When an oversized display panel is manufactured, it is necessary to increase a thickness of a data line to reduce its resistance. The data line is arranged at a same layer as a source/drain metal layer, so a thickness of the source/drain metal layer also increases. An organic semiconductor (OSC) in an organic thin film transistor (OTFT) has a small thickness, so the uniformity of the OSC is adversely affected.

SUMMARY

An object of the present disclosure is to provide a display substrate, a manufacturing method thereof, and a display device, so as to improve the uniformity of the OSC.

In one aspect, the present disclosure provides in some embodiments a display substrate, including: a base substrate; a thin film transistor located on the base substrate, the thin film transistor including a source electrode, a drain electrode, an active layer located at a side of the source electrode and the drain electrode away from the base substrate, and a gate electrode located at a side of the active layer away from the base substrate, and a thickness of the source electrode and a thickness of the drain electrode being less than a predetermined threshold: a protection layer located at a side of the thin film transistor away from the base substrate, the protection layer including a first via hole and a second via hole, and a conductive connection pattern being arranged in the first via hole; and a data line arranged at a same layer and made of a same material as the gate electrode, the data line being coupled to the source electrode of the thin film transistor through the conductive connection pattern in the first via hole in the protection layer.

In a possible embodiment of the present disclosure, the display substrate further includes a gate line located at a side of the protection layer away from the base substrate and coupled to the gate electrode though the second via hole penetrating through the protection layer.

In a possible embodiment of the present disclosure, the second via hole is filled with a conductive connection structure through which the gate line is coupled to the gate electrode, and the conductive connection structure is made of a same material as a common electrode of the display substrate.

In a possible embodiment of the present disclosure, the conductive connection pattern includes a first conductive connection pattern and a second conductive connection pattern laminated one on another, the first conductive connection pattern is made of a same material as the common electrode, and the second conductive connection pattern is made of a same material as the gate line.

In a possible embodiment of the present disclosure, the display substrate further includes a pixel electrode coupled to the drain electrode and lapped onto the drain electrode.

In a possible embodiment of the present disclosure, the display substrate further includes a light shielding pattern located at a side of the active layer close to the base substrate, and an orthogonal projection of the active layer onto the base substrate is within an orthogonal projection of the light shielding pattern onto the base substrate.

In a possible embodiment of the present disclosure, the display substrate further includes a first planarization layer and a second planarization layer, and the light shielding pattern is located between the first planarization layer and the second planarization layer.

In a possible embodiment of the present disclosure, the active layer is made of an organic semiconductor.

In a possible embodiment of the present disclosure, a thickness of the active layer ranges from 10 Å to 3000 Å.

In a possible embodiment of the present disclosure, the base substrate includes a glass substrate, a tantalum carbide (TAC) substrate, and a carrier adhesive through which the glass substrate is adhered to the TAC substrate.

In another aspect, the present disclosure provides in some embodiments a display device including the above-mentioned display substrate.

In yet another aspect, the present disclosure provides in some embodiments a method for manufacturing a display substrate, including: providing a base substrate: forming a thin film transistor on the base substrate, the thin film transistor including a source electrode, a drain electrode, an active layer located at a side of the source electrode and the drain electrode away from the base substrate, and a gate electrode located at a side of the active layer away from the base substrate, and a thickness of the source electrode and a thickness of the drain electrode being less than a predetermined threshold: forming a protection layer at a side of the thin film transistor away from the base substrate, the protection layer including a first via hole and a second via hole, and a conductive connection pattern being arranged in the first via hole: and forming a data line arranged at a same layer and made of a same material as the gate electrode, the data line being coupled to the source electrode of the thin film transistor through the conductive connection pattern in the first via hole of the protection layer.

REFERENCE SIGN LIST

Figure 1:
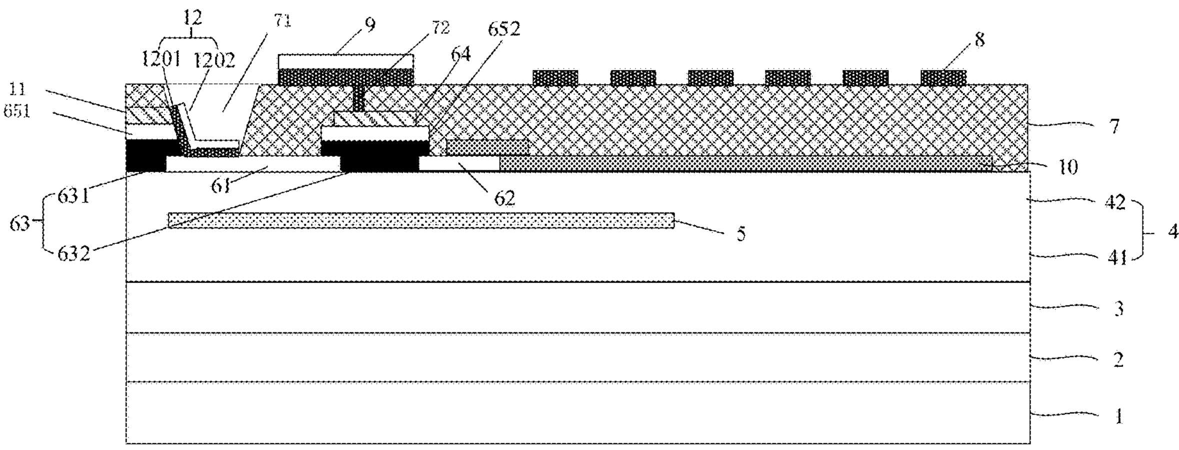
FIG. 1 is a schematic view showing a display substrate according to one embodiment of the present disclosure.

1 glass substrate
2 carrier adhesive
3 TAC substrate
4 planarization layer
41 first planarization layer
42 second planarization layer
5 light shielding pattern
61 source electrode
611 first source electrode portion
612 second source electrode portion
62 drain electrode
63 active layer
631 first active portion
632 second active portion
64 gate electrode
641 first gate electrode portion
642 second gate electrode portion
65 gate insulation layer
651 first gate insulation portion
652 second gate insulation portion
7 protection layer
71 first via hole
72 second via hole
8 common electrode
9 gate line
10 pixel electrode
11 data line
12 conductive connection pattern
1201 first conductive connection pattern
1202 second conductive connection pattern

DETAILED DESCRIPTION

In order to make the objects, the technical solutions and the advantages of the present disclosure more apparent, the present disclosure will be described hereinafter in a clear and complete manner in conjunction with the drawings and embodiments.

Electronic/optoelectronic devices made of an OSC have attracted more and more attention due to a high on-state current and a good on-off time ratio, and the electronic products are flexible due to mechanical characteristics of the OSC.

When an oversized display panel is manufactured, in a top-gate bottom-contact OTFT, a thickness of a source/drain metal layer is greater than 2000 Å, and a thickness of an OSC material is merely 500 Å, so film thickness uniformity in a channel region will be adversely affected due to a thickness difference.

An object of the present disclosure is to provide a display substrate, a manufacturing method thereof, and a display device, so as to improve the uniformity of the OSC through adjusting a position of a film layer without changing an original process, providing more masks or changing the thickness of the source/drain metal layer.

The present disclosure provides in some embodiments a display substrate, which includes: a base substrate: a thin film transistor located on the base substrate, the thin film transistor including a source electrode, a drain electrode, an active layer located at a side of the source electrode and the drain electrode away from the base substrate, and a gate electrode located at a side of the active layer away from the base substrate, and a thickness of the source electrode and a thickness of the drain electrode being less than a predetermined threshold: a protection layer located at a side of the thin film transistor away from the base substrate, the protection layer including a first via hole and a second via hole, and a conductive connection pattern being arranged in the first via hole: and a data line arranged at a same layer and made of a same material as the gate electrode, the data line being coupled to the source electrode of the thin film transistor through the conductive connection pattern in the first via hole of the protection layer.

Figure 2:
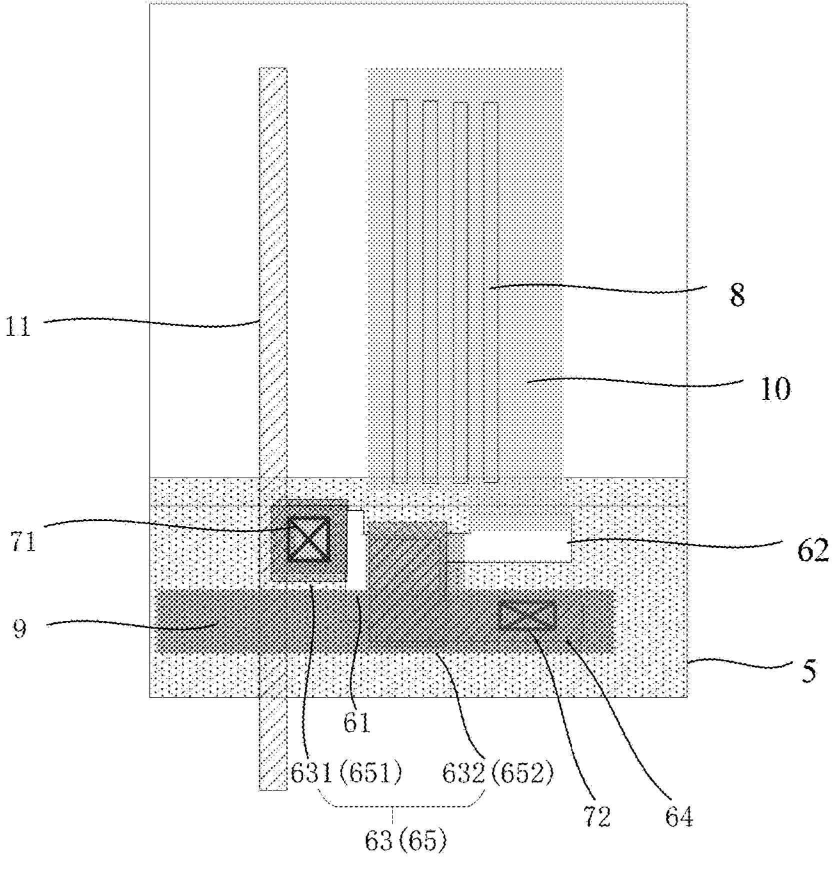
FIG. 2 is a schematic view showing the arrangement of a circuitry of the display substrate according to one embodiment of the present disclosure.

As shown in FIG. 1 and FIG. 2, the present disclosure provides in some embodiments a display substrate, which includes: a base substrate: a thin film transistor located on the base substrate, the thin film transistor including a source electrode 61, a drain electrode 62, an active layer 63 located at a side of the source electrode 61 and the drain electrode 62 away from the base substrate, and a gate electrode 64 located at a side of the active layer 63 away from the base substrate, and a thickness of the source electrode 61 and a thickness of the drain electrode 62 being less than a predetermined threshold: a protection layer 7 located at a side of the thin film transistor away from the base substrate, the protection layer 7 including a first via hole 71 and a second via hole 72, and a conductive connection pattern 12 being arranged in the first via hole: and a data line 11 arranged at a same layer and made of a same material as the gate electrode 64, the data line 11 being coupled to the source electrode 61 of the thin film transistor through the conductive connection pattern 12 in the first via hole 71 of the protection layer 7.

A source/drain metal layer is made of Cuprum (Cu), Aluminium (Al), Argentum (Ag), Molybdenum (Mo), Chromium (Cr), Neodymium (Nd), Nickel (Ni), Manganese (Mn), Titanium (Ti), Tantalum (Ta), Tungsten (W), or an alloy thereof, and it has a single-layer structure or a multi-layer structure, such as Cu\Mo, Ti\Cu\Ti, or Mo\Al\Mo.

A gate metal layer is made of Cu, Al, Ag, Mo, Cr, Nd, Ni, Mn, Ti, Ta, W or an alloy thereof, and it has a single-layer structure or a multi-layer structure, such as Cu\Mo, Ti\Cu\Ti, or Mo\Al\Mo.

The protection layer is made of an oxide, a nitride, or an oxynitride. Specifically, the protection layer is made of SiNx, SiOx, Si(ON)x, or $Al_2O_3$. The protection layer has a single-layer structure, or a double-layer structure including a silicon nitride layer and a silicon oxide layer. A reactive gas corresponding to silicon oxide is a mixture of $SiH_4$ and $N_2O$, and a reactive gas corresponding to nitride or oxynitride is a mixture of $SiH_4$, $NH_3$ and $N_2$ or a mixture of $SiH_2Cl_2$, $NH_3$ and $N_2$. A pattern of a passivation layer including a via hole is formed through a single patterning process.

In the related art, when an oversized display panel is manufactured, a thickness of the source/drain metal layer is too large, e.g., 3000 Å, resulting in a decrease in the flatness of the OSC in the channel region of the source/drain metal layer. According to the display substrate in the embodiments of the present disclosure, the thickness of the source/drain metal layer is less than the predetermined threshold, so it is able to ensure the uniformity of the active layer in the case that the thickness of the source electrode and the thickness of the drain electrode are small.

In the embodiments of the present disclosure, the data line is arranged at the first gate metal layer where the gate electrode 64 is located, so as to not increase the thickness of the source/drain metal layer while increasing the thickness of the data lien to reduce a resistance of the data line, thereby to prevent the uniformity of the active layer from being adversely affected.

For example, the display substrate further includes a gate line located at a side of the protection layer away from the base substrate and coupled to the gate electrode though the second via hole penetrating through the protection layer.

As shown in FIG. 1 and FIG. 2, the display substrate further includes a gate line 9 located at a side of the protection layer 7 away from the base substrate and coupled to the gate electrode 64 though the second via hole 72 penetrating through the protection layer 7.

According to the display substrate in the embodiments of the present disclosure, the gate electrode is coupled to the gate line through the second via hole in the protection layer, so as to apply a gate voltage to the gate electrode.

For example, the second via hole is filled with a conductive connection structure through which the gate line is coupled to the gate electrode, and the conductive connection structure is made of a same material as a common electrode of the display substrate.

The common electrode is made of indium tin oxide (ITO), indium zinc oxide (IZO), or any other transparent metal oxides.

As shown in FIG. 1, the second via hole 72 is filled with a conductive connection structure through which the gate line 9 is coupled to the gate electrode 64, and the conductive connection structure is made of a same material as the common electrode 8 of the display substrate.

According to the embodiments of the present disclosure, the conductive connection structure is made of a same material as the common electrode of the display substrate, so as to reduce the quantity of masks.

For example, the conductive connection pattern includes a first conductive connection pattern and a second conductive connection pattern laminated one on another, the first conductive connection pattern is made of a same material as the common electrode, and the second conductive connection pattern is made of a same material as the gate line.

Figure 8:
FIG. 8 is a schematic view showing the arrangement of a second gate metal layer in FIG. 2.
Figure 9:
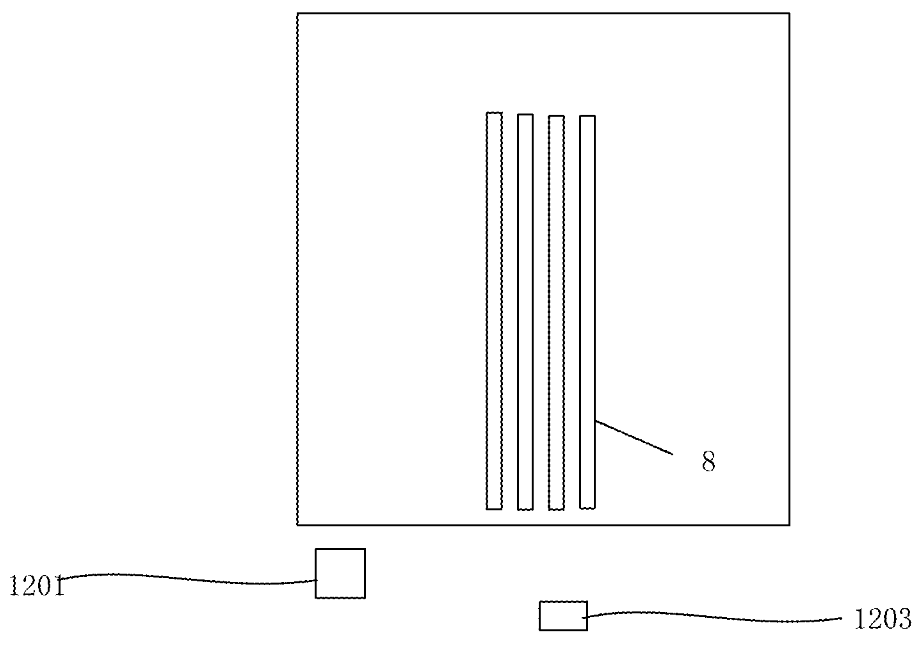
FIG. 9 is a schematic view showing the arrangement of a common electrode in FIG. 2.

As shown in FIG. 1, FIG. 8 and FIG. 9, the conductive connection pattern 12 includes a first conductive connection pattern 1201 and a second conductive connection pattern 1202 laminated one on another, the first conductive connection pattern 1201 is made of a same material as the common electrode 8, and the second conductive connection pattern 1202 is made of a same material as the gate line 9.

According to the embodiments of the present disclosure, when the first conductive connection pattern is made of a same material as the common electrode and the second conductive connection pattern is made of a same material as the gate line, it is able to form the first conductive connection pattern 1201 and the common electrode 8 through a single patterning process, and form the second conductive connection pattern 1202 and the gate line 9 through a single patterning process, thereby to reduce the quantity of masks.

For example, the display substrate further includes a pixel electrode coupled to the drain electrode and lapped onto the drain electrode.

The pixel electrode is made of ITO, IZO, or any other transparent metal oxides.

As shown in FIG. 1 and FIG. 2, the display substrate further includes a pixel electrode 10 coupled to the drain electrode 62 and lapped onto the drain electrode 62.

According to the embodiments of the present disclosure, when the pixel electrode is lapped onto the drain electrode, it is able to apply a data voltage to the pixel electrode when the thin film transistor is turned on.

For example, the display substrate further includes a light shielding pattern located at a side of the active layer close to the base substrate, and an orthogonal projection of the active layer onto the base substrate is within an orthogonal projection of the light shielding pattern onto the base substrate.

As shown in FIG. 1 and FIG. 2, the display substrate further includes a light shielding pattern 5 located at a side of the active layer 63 close to the base substrate, and an orthogonal projection of the active layer 63 onto the base substrate is within an orthogonal projection of the light shielding pattern 5 onto the base substrate.

According to the embodiments of the present disclosure, through the light shielding pattern, it is able to prevent a channel portion of the active layer from being adversely affected by electromagnetic signals, thereby to prevent the performance of the thin film transistor from being adversely affected.

For example, the display substrate further includes a first planarization layer and a second planarization layer, and the light shielding pattern is located between the first planarization layer and the second planarization layer.

As shown in FIG. 1 and FIG. 2, the display substrate further includes a first planarization layer 41 and a second planarization layer 42, and the light shielding pattern 5 is located between the first planarization layer 41 and the second planarization layer 42. The first planarization layer 41 and the second planarization layer 42 are collectively referred to as a planarization layer 4.

According to the embodiments of the present disclosure, through the planarization layer, it is able to achieve the planarization between the film layers.

For example, the active layer is made of an OSC.

As shown in FIG. 1 and FIG. 2, the active layer 63 is made of an OSC.

Due to excellent processing performance and mechanical performance of the OSC, it is able to process the OTFT at a large area with a simple process, and reduce the processing cost. In addition, the OTFT has excellent bending performance. For example, a thickness of the active layer ranges from 10 Å to 3000 Å.

As shown in FIG. 1 and FIG. 2, a thickness of the active layer 63 ranges from 10 Å to 3000 Å.

According to the embodiments of the present disclosure, when the thickness of the active layer 63 ranges from 10 Å to 3000 Å, it is able to ensure the performance of the thin film transistor as well as the uniformity of the active layer between the source electrode and the drain electrode.

For example, the base substrate includes a glass substrate, a TAC substrate, and a carrier adhesive through which the glass substrate is adhered to the TAC substrate.

As shown in FIG. 1 and FIG. 2, the base substrate includes a glass substrate 1, a TAC substrate 3, and a carrier adhesive 2 through which the glass substrate 1 is coupled to the TAC substrate 3.

According to the embodiments of the present disclosure, when the base substrate includes the glass substrate, the TAC substrate, and the carrier adhesive through which the glass substrate is coupled to the TAC substrate, it is able to improve a support capability, optical uniformity, and transparency of the base substrate.

FIG. 3 to FIG. 10 show the arrangement of the film layers of the base substrate during the manufacture.

Figure 3:
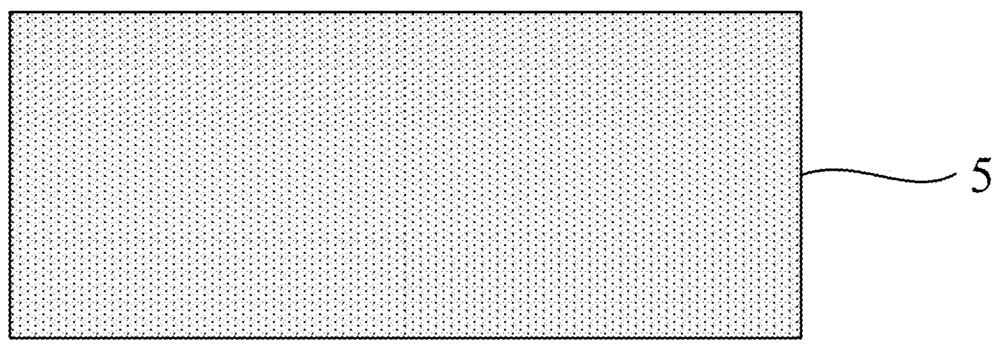
FIG. 3 is a schematic view showing the arrangement of a light shielding pattern in FIG. 2.

FIG. 3 shows the arrangement of the light shielding pattern in FIG. 2, and the light shielding pattern 5 is used to shield the electromagnetic signals for the active layer 63.

Figure 4:
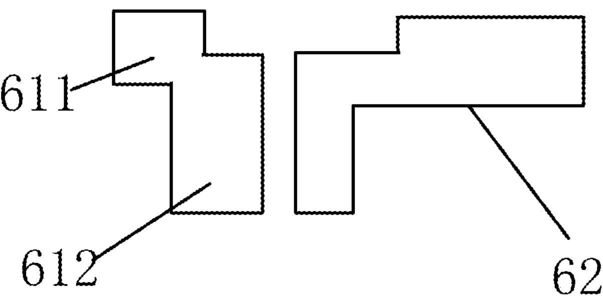
FIG. 4 is a schematic view showing the arrangement of a source/drain metal layer in FIG. 2.

FIG. 4 shows the arrangement of the source/drain metal layer in FIG. 2, the source/drain metal layer is provided with the source electrode 61 and the drain electrode 62 of the thin film transistor, and a thickness of the source/drain metal layer is 800 Å. The source electrode 61 includes a first source electrode portion 611 and a second source electrode portion 612.

Figure 5:
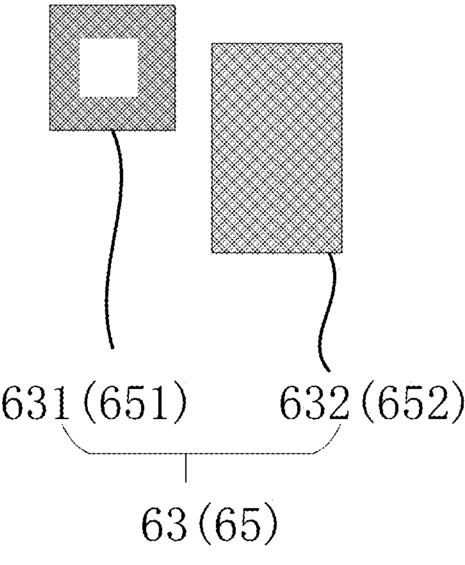
FIG. 5 is a schematic view showing the arrangement of an OSC and a gate insulation layer in FIG. 2.

FIG. 5 shows the arrangement of an OSC and a gate insulation layer in FIG. 2, the active layer is made of an OSC material, and the gate insulation layer 65 is located between the active layer 63 and the gate electrode 64. It should be appreciated that, a shape of the gate insulation layer 65 is the same as a shape of the active layer 63, the active layer includes a first active portion 631 and a second active portion 632, and the gate insulation layer includes a first gate insulation portion 651 and a second gate insulation portion 652.

Figure 6:
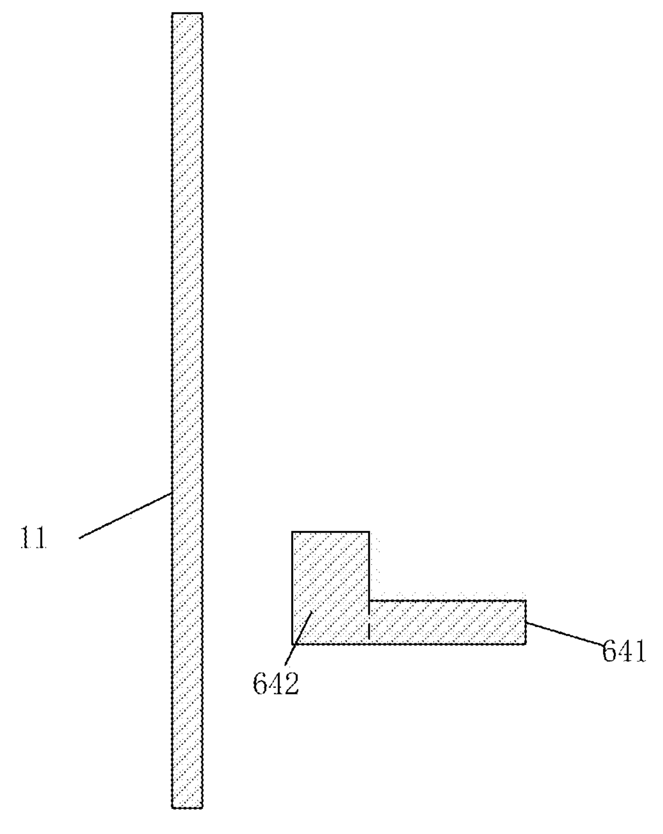
FIG. 6 is a schematic view showing the arrangement of a first gate metal layer in FIG. 2.

FIG. 6 shows the arrangement of a first gate metal layer in FIG. 2, and the gate electrode 64 and the data line 11 are arranged on the first gate metal layer. The gate electrode 64 includes a first gate electrode portion 641 and a second gate electrode portion 642.

Figure 7:
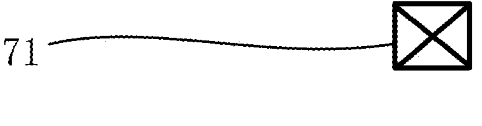
FIG. 7 is a schematic view showing the arrangement of via holes in FIG. 2.
Figure 7:

FIG. 7 shows the arrangement of via holes in FIG. 2, the first via hole 71 is formed in the planarization layer 4 and the conductive connection pattern is arranged in the first via hole 71, so as to enable the data line 11 located on the first gate metal layer to be coupled to the source electrode 61 located on the source/drain metal layer, thereby to enable the source electrode to receive a data voltage signal. The second via hole 72 is formed in the planarization layer 4 and the conductive connection structure is arranged in the second via hole 72, so as to enable the gate line 9 located on the second gate metal layer to be coupled to the gate electrode 64 located on the first gate metal layer, thereby to apply a voltage signal to the gate electrode.

FIG. 8 shows the arrangement of the second gate metal layer in FIG. 2, the gate line 9 and the conductive connection pattern 12 in the first via hole 71 are arranged on the second gate metal layer.

FIG. 9 shows the arrangement of the common electrode in FIG. 2. In the embodiments of the present disclosure, the common electrode 8 includes a plurality of strip-like electrodes.

Figure 10:
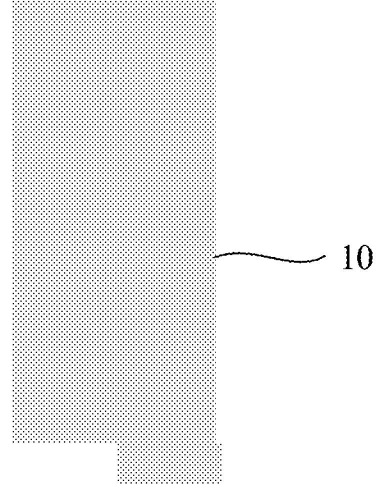
FIG. 10 is a schematic view showing the arrangement of a pixel electrode in FIG. 2.

FIG. 10 shows the arrangement of the pixel electrode in FIG. 2. As shown in FIG. 1, FIG. 2, FIG. 4 and FIG. 10, the pixel electrode 10 is lapped onto the drain electrode 62.

FIG. 1, FIG. 2, and FIG. 4 to FIG. 9 show the connection of the film layers at the first via hole 71. The first active portion 631 of the active layer 63 is arranged at a side of the first source electrode portion 611 of the source electrode 61 away from the base substrate, the first gate insulation portion 651 with a same shape as the first active portion 631 is arranged at a side of the first active portion 631 away from the base substrate, the first via hole 71 penetrates through the first active portion 631 and the first gate insulation portion 651, the first via hole 71 is filled with the first conductive connection pattern 1201 and the second conductive connection pattern 1202, the data line 11 is exposed at a side wall of the first via hole, and the data line 11 is coupled to the source electrode through the first conductive connection pattern 1201 and the second conductive connection pattern 1202.

As shown in FIG. 1, FIG. 2, and FIG. 6 to FIG. 9, at the second via hole 72, the first gate electrode portion 641 of the gate electrode 64 is coupled to the gate line 9 through a third conductive connection pattern 1203 filled in the second via hole 72.

The present disclosure further provides in some embodiments a display device, which includes the above-mentioned display substrate.

The display device includes, but not limited to, a radio frequency unit, a network module, an audio output unit, an input unit, a sensor, a display unit, a user input unit, an interface unit, a memory, a processor, and a power source. It should be appreciated that, the display device may not be limited thereto, i.e., it may include more or fewer members, or some members may be combined, or the members may be arranged in different modes. In the embodiments of the present disclosure, the display device may include, but not limited to, display, mobile phone, flat-panel computer, television, wearable electronic device or navigator.

The display device may be any product or member having a display function, such as a television, a display, a digital photo frame, a mobile phone and a tablet computer. The display device further includes a flexible circuit board, a printed circuit board and a back plate.

The present disclosure further provides in some embodiments a method for manufacturing a display substrate, which includes: providing a base substrate, the base substrate including a glass substrate, a TAC substrate, and a carrier adhesive through which the glass substrate is coupled to the TAC substrate: forming a thin film transistor located on the base substrate, the thin film transistor including a source electrode, a drain electrode, an active layer located at a side of the source electrode and the drain electrode away from the base substrate, and a gate electrode located at a side of the active layer away from the base substrate, a thickness of the source electrode and a thickness of the drain electrode being less than a predetermined threshold, the active layer being made of an organic semiconductor, and a thickness of the active layer ranging from 10 Å to 3000 Å; forming a protection layer located at a side of the thin film transistor away from the base substrate, the protection layer including a first via hole and a second via hole, and a conductive connection pattern being arranged in the first via hole: and forming a data line arranged at a same layer and made of a same material as the gate electrode, the data line being coupled to the source electrode of the thin film transistor through the conductive connection pattern in the first via hole of the protection layer.

For example, the method further includes: forming a common electrode at a side of the protection layer away from the base substrate, and forming a conductive connection structure in the second via hole while forming the common electrode, the gate line being coupled to the gate electrode through the conductive connection structure, the conductive connection structure being made of a same material as the common electrode of the display substrate: and forming a first conductive connection pattern in the first via hole, the first conductive connection pattern being made of a same material as the common electrode.

For example, the method further includes: forming a gate line and a second conductive connection pattern at a side of the protection layer away from the common electrode, the gate line being coupled to the gate electrode though the second via hole penetrating through the protection layer, and the second conductive connection pattern being made of a same material as the gate line.

For example, the method further includes forming a pixel electrode coupled to the drain electrode and lapped onto the drain electrode.

For example, the method further includes forming a light shielding pattern at a side of the active layer close to the base substrate, and an orthogonal projection of the active layer onto the base substrate is within an orthogonal projection of the light shielding pattern onto the base substrate.

For example, the method further includes forming a first planarization layer and a second planarization layer, and the light shielding pattern is located between the first planarization layer and the second planarization layer.

In the embodiments of the present disclosure, the order of the steps is not limited to the serial numbers thereof. For a person skilled in the art, any change in the order of the steps shall also fall within the scope of the present disclosure if without any creative effort.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising:

a base substrate;

a thin film transistor located on the base substrate, the thin film transistor comprising a source electrode, a drain electrode, an active layer located at a side of the source electrode and the drain electrode away from the base substrate, and a gate electrode located at a side of the active layer away from the base substrate, and a thickness of the source electrode and a thickness of the drain electrode being less than a predetermined threshold;

a protection layer located at a side of the thin film transistor away from the base substrate, the protection layer comprising a first via hole and a second via hole, and a conductive connection pattern being arranged in the first via hole;

a data line arranged at a same layer and made of a same material as the gate electrode, the data line being coupled to the source electrode of the thin film transistor through the conductive connection pattern in the first via hole of the protection layer; and a pixel electrode directly connected to the drain electrode and lapped onto the drain electrode, wherein the pixel electrode is arranged at a same layer as the drain electrode;

wherein the first via hole and the second via hole are mutually independent structures not in direct electrical contact with each other;

wherein the display substrate further comprises a gate line located at a side of the protection layer away from the base substrate and coupled to the gate electrode though the second via hole penetrating through the protection layer;

wherein the second via hole is filled with a conductive connection structure through which the gate line is coupled to the gate electrode, and the conductive connection structure is made of a same material as a common electrode of the display substrate;

wherein the conductive connection pattern comprises a first conductive connection pattern and a second conductive connection pattern laminated one on another, the first conductive connection pattern is made of a same material as the common electrode, and the second conductive connection pattern is made of a same material as the gate line.

2. The display substrate according to claim 1, further comprising a light shielding pattern located between the active layer and the base substrate, wherein an orthogonal projection of the active layer onto the base substrate is within an orthogonal projection of the light shielding pattern onto the base substrate.

3. The display substrate according to claim 1, further comprising a first planarization layer and a second planarization layer, wherein a light shielding pattern is located between the first planarization layer and the second planarization layer.

4. The display substrate according to claim 1, wherein the active layer is made of an organic semiconductor (OSC).

5. The display substrate according to claim 1, wherein a thickness of the active layer ranges from 10 Å to 3000 Å.

6. The display substrate according to claim 1, wherein the base substrate comprises a glass substrate, a tantalum carbide (TAC) substrate, and a carrier adhesive through which the glass substrate is adhered to the TAC substrate.

7. A display device, comprising a display substrate, wherein the display substrate comprises:

a base substrate;

a thin film transistor located on the base substrate, the thin film transistor comprising a source electrode, a drain electrode, an active layer located at a side of the source electrode and the drain electrode away from the base substrate, and a gate electrode located at a side of the active layer away from the base substrate, and a thickness of the source electrode and a thickness of the drain electrode being less than a predetermined threshold;

a protection layer located at a side of the thin film transistor away from the base substrate, the protection layer comprising a first via hole and a second via hole, and a conductive connection pattern being arranged in the first via hole;

a data line arranged at a same layer and made of a same material as the gate electrode, the data line being coupled to the source electrode of the thin film transistor through the conductive connection pattern in the first via hole of the protection layer; and a pixel electrode directly connected to the drain electrode and lapped onto the drain electrode, wherein the pixel electrode is arranged at a same layer as the drain electrode;

wherein the first via hole and the second via hole are mutually independent structures not in direct electrical contact with each other;

wherein the display substrate further comprises a gate line located at a side of the protection layer away from the base substrate and coupled to the gate electrode though the second via hole penetrating through the protection layer;

wherein the second via hole is filled with a conductive connection structure through which the gate line is coupled to the gate electrode, and the conductive connection structure is made of a same material as a common electrode of the display substrate;

wherein the conductive connection pattern comprises a first conductive connection pattern and a second conductive connection pattern laminated one on another, the first conductive connection pattern is made of a same material as the common electrode, and the second conductive connection pattern is made of a same material as the gate line.

8. The display device according to claim 7, wherein the display substrate further comprises a light shielding pattern located between the active layer and the base substrate, wherein an orthogonal projection of the active layer onto the base substrate is within an orthogonal projection of the light shielding pattern onto the base substrate.

9. The display device according to claim 7, wherein the display substrate further comprises a first planarization layer and a second planarization layer, wherein a light shielding pattern is located between the first planarization layer and the second planarization layer.

10. The display device according to claim 7, wherein the active layer is made of an organic semiconductor (OSC).

11. The display device according to claim 7, wherein a thickness of the active layer ranges from 10 Å to 3000 Å.

12. A method for manufacturing a display substrate, comprising:

providing a base substrate;

forming a thin film transistor on the base substrate, the thin film transistor comprising a source electrode, a drain electrode, an active layer located at a side of the source electrode and the drain electrode away from the base substrate, and a gate electrode located at a side of the active layer away from the base substrate, and a thickness of the source electrode and a thickness of the drain electrode being less than a predetermined threshold;

forming a protection layer at a side of the thin film transistor away from the base substrate, the protection layer comprising a first via hole and a second via hole, and a conductive connection pattern being arranged in the first via hole;

forming a data line arranged at a same layer and made of a same material as the gate electrode, the data line being coupled to the source electrode of the thin film transistor through the conductive connection pattern in the first via hole of the protection layer; and forming a pixel electrode directly connected to the drain electrode and lapped onto the drain electrode, wherein the pixel electrode is arranged at a same layer as the drain electrode;

wherein the first via hole and the second via hole are mutually independent structures not in direct electrical contact with each other;

wherein the method further comprises: forming a common electrode at a side of the protection layer away from the base substrate, forming a conductive connection structure in the second via hole while forming the common electrode, forming a first conductive connection pattern in the first via hole the gate line being coupled to the gate electrode though the second via hole penetrating through the protection layer, and forming a gate line and a second conductive connection pattern at a side of the protection layer away from the common electrode, the gate line being coupled to the gate electrode through the conductive connection structure, the conductive connection structure being made of a same material as the common electrode of the display substrate, the first conductive connection pattern being made of a same material as the common electrode, and the second conductive connection pattern being made of a same material as the gate line.

* * * * *